United States Patent
Iwasaki

(10) Patent No.: US 11,602,045 B2
(45) Date of Patent: Mar. 7, 2023

(54) ELASTIC MOUNTING BOARD

(71) Applicant: Murata Manufacturing Co., Ltd., Nagaokakyo (JP)

(72) Inventor: Kazuki Iwasaki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 18 days.

(21) Appl. No.: 17/238,812

(22) Filed: Apr. 23, 2021

(65) Prior Publication Data
US 2021/0243884 A1 Aug. 5, 2021

Related U.S. Application Data

(63) Continuation of application No. PCT/JP2019/034175, filed on Aug. 30, 2019.

(30) Foreign Application Priority Data

Jan. 30, 2019 (JP) .............................. JP2019-014360

(51) Int. Cl.
*H05K 1/02* (2006.01)
*H05K 1/03* (2006.01)

(52) U.S. Cl.
CPC ........... *H05K 1/028* (2013.01); *H05K 1/0393* (2013.01)

(58) Field of Classification Search
CPC ............ H05K 1/02; H05K 1/028; H05K 1/03; H05K 1/0393
USPC ....................................................... 174/68.1
See application file for complete search history.

(56) References Cited

U.S. PATENT DOCUMENTS

| | | | |
|---|---|---|---|
| 8,075,098 B2 | 12/2011 | Yamashita | |
| 2008/0316273 A1 | 12/2008 | Yamashita | |
| 2018/0356683 A1* | 12/2018 | Higano | ................ G06F 3/04164 |
| 2019/0290158 A1 | 9/2019 | Sekitani et al. | |

FOREIGN PATENT DOCUMENTS

| | | | |
|---|---|---|---|
| JP | 2006253294 A | 9/2006 |
| JP | 2007258219 A | 10/2007 |
| JP | 2009004418 A | 1/2009 |
| JP | 2017143257 A | 8/2017 |
| JP | 2017217098 A | 12/2017 |

OTHER PUBLICATIONS

Written Opinion of the International Search Authority issued for PCT/JP2019/034175, dated Nov. 19, 2019.
International Search Report issued for PCT/JP2019/034175, dated Nov. 19, 2019.

* cited by examiner

*Primary Examiner* — Tremesha S Willis
(74) *Attorney, Agent, or Firm* — ArentFox Schiff LLP

(57) ABSTRACT

An elastic mounting board that includes: a first elastic substrate; an elastic wiring on a first main surface of the first elastic substrate; an electrode electrically connected to the elastic wiring; and a functional component mounted in a mounting portion of the first elastic substrate and electrically connected to the elastic wiring, in which the mounting portion having the functional component is folded back such that the functional component will face a first main surface side of the elastic mounting board and the electrode will face a second main surface side of the elastic mounting board.

19 Claims, 5 Drawing Sheets

ELASTIC MOUNTING BOARD

CROSS REFERENCE TO RELATED APPLICATIONS

The present application is a continuation of International application No. PCT/JP2019/034175, filed Aug. 30, 2019, which claims priority to Japanese Patent Application No. 2019-014360, filed Jan. 30, 2019, the entire contents of each of which are incorporated herein by reference.

FIELD OF THE INVENTION

The present invention relates to an elastic mounting board.

BACKGROUND OF THE INVENTION

In recent years, it has been practiced to manage a state or the like of a living body (for example, a human body) by acquiring and analyzing biological information using a wiring board.

Functional components such as amplifiers and connectors may be mounted on such wiring boards. For example, Patent Document 1 discloses an electrode sheet in which a biological signal amplifier is formed on the sheet.

Patent Document 1: Japanese Patent Application Laid-Open No. 2017-217098

SUMMARY OF THE INVENTION

In the electrode sheet disclosed in Patent Document 1, in a case where the sheet has elasticity, it is necessary to make the elasticity of a portion of the sheet where the biological signal amplifier is formed smaller than the elasticity of the other portions. This is to suppress changes in signal amplification characteristics (for example, gain for each frequency) of the biological signal amplifier when the electrode sheet expands and contracts, and to prevent damage to the biological signal amplifier. However, if such an electrode sheet expands and contracts significantly when being attached to a living body, there is a problem that the biological signal amplifier comes off.

The present invention has been made to solve the above problems, and an object of the present invention is to provide an elastic mounting board in which it is difficult for a functional component to come off during expansion and contraction.

An elastic mounting board of the present invention includes: a first elastic substrate; an elastic wiring on a first main surface of the first elastic substrate; an electrode electrically connected to the elastic wiring; and a functional component mounted in a mounting portion of the first elastic substrate and electrically connected to the elastic wiring, in which the mounting portion having the functional component is constructed to be folded back such that the functional component will face a first main surface side of the elastic mounting board and the electrode will face a second main surface side of the elastic mounting board.

According to the present invention, it is possible to provide an elastic mounting board in which it is difficult for a functional component to come off during expansion and contraction.

DETAILED DESCRIPTION OF THE INVENTION

Hereinafter, an elastic mounting board of the present invention will be described. The present invention is not limited to the following configuration, and may be appropriately modified within a scope not departing from the gist of the present invention. In addition, a combination of a plurality of individual preferred configurations described below is also included in the present invention.

Each of the embodiments illustrated below is merely an example, and partial replacement or combination of the configurations illustrated in different embodiments is possible. In the second and subsequent embodiments, the description of the matters common to the first embodiment will be omitted, and the different points will be mainly described. In particular, similar actions and effects by similar configurations will not be mentioned sequentially for each embodiment. In the following description, in a case where each embodiment is not particularly distinguished, it is simply referred to as the "elastic mounting board of the present invention".

An elastic mounting board of the present invention includes: a first elastic substrate; an elastic wiring on a first main surface of the first elastic substrate; an electrode electrically connected to the elastic wiring; and a functional component mounted in a mounting portion of the first elastic substrate and electrically connected to the elastic wiring, in which the mounting portion having the functional component is constructed to be folded back such that the functional component will face a first main surface side of the elastic mounting board and the electrode will face a second main surface side of the elastic mounting board. Further, the elastic mounting board of the present invention may further include a second elastic substrate which is arranged such that the elastic wiring is interposed between the second elastic substrate and the first elastic substrate, and in which the second elastic substrate defines a first opening and a second opening, in which the electrode may be arranged in the first opening, and the functional component may be arranged in the second opening. In this manner, in the elastic mounting board of present the invention, it is not an essential requirement to have the second elastic substrate in addition to the first elastic substrate, but in each of the embodiments described below, an example in which the elastic mounting board has the first elastic substrate and the second elastic substrate is illustrated.

First Embodiment

In the elastic mounting board of the present invention, the functional component may be an amplifier. Such an example will be described as an elastic mounting board according to the first embodiment of the present invention.

Figure 1:
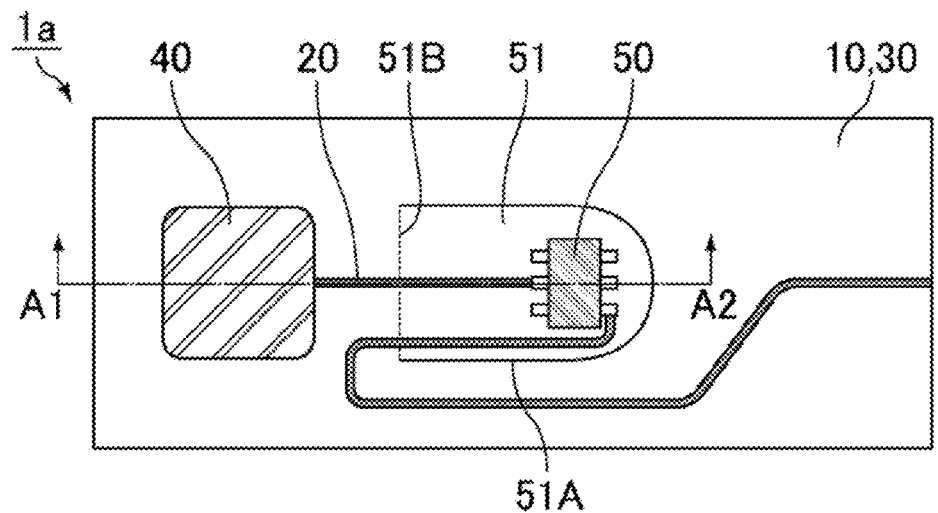
FIG. 1 is a schematic plan view which relates to an elastic mounting board according to a first embodiment of the present invention, and illustrates a state before a mounting portion of an amplifier is folded back.
Figure 2:
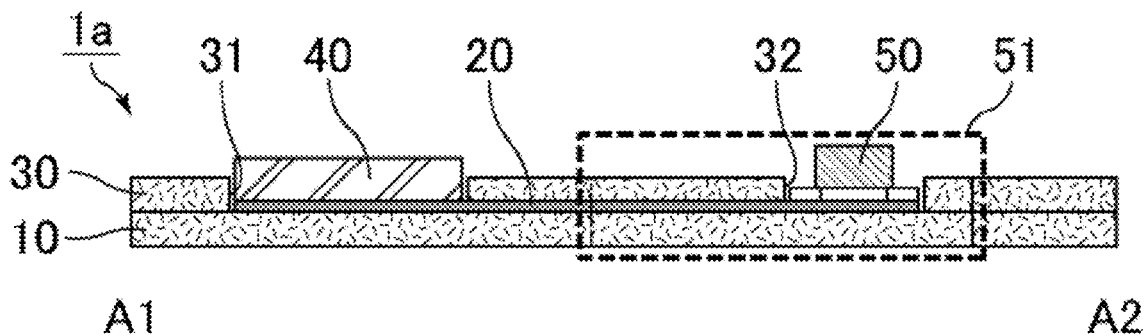
FIG. 2 is a schematic sectional view illustrating a portion corresponding to a line segment A1-A2 in FIG. 1.

FIG. 1 is a schematic plan view which relates to the elastic mounting board according to the first embodiment of the present invention, and illustrates a state before a mounting portion of an amplifier is folded back. FIG. 2 is a schematic sectional view illustrating a portion corresponding to a line segment A1-A2 in FIG. 1.

As illustrated in FIGS. 1 and 2, an elastic mounting board 1a includes a first elastic substrate 10, an elastic wiring 20, a second elastic substrate 30, an electrode 40, and an amplifier 50. In addition, in FIG. 1, the first elastic substrate 10 and the second elastic substrate 30 are illustrated as being transparent.

The elastic wiring 20 is arranged on a first main surface of the first elastic substrate 10.

The second elastic substrate 30 is arranged such that the elastic wiring 20 is interposed between the second elastic substrate 30 and the first elastic substrate 10. The second elastic substrate 30 is provided with a first opening 31 and a second opening 32.

The electrode 40 is arranged in the first opening 31 of the second elastic substrate 30 to be on a main surface of the elastic wiring 20 (on the surface on a side opposite to the first elastic substrate 10). That is, the electrode 40 is electrically connected to the elastic wiring 20.

The amplifier 50 is mounted in the second opening 32 of the second elastic substrate 30 to be on the first main surface of the elastic wiring 20 (on the surface on a side opposite to the first elastic substrate 10). That is, the amplifier 50 is electrically connected to the elastic wiring 20.

FIG. 1 illustrates a state in which the elastic mounting board 1a is viewed in a plan view from a second main surface side of the elastic mounting board 1a. In FIG. 2, the upper side is the second main surface side of the elastic mounting board 1a, and the lower side is a first main surface side of the elastic mounting board 1a. Therefore, in the state before a mounting portion 51 of the amplifier is folded back, both the electrode 40 and the amplifier 50 face the second main surface side of the elastic mounting board 1a.

Figure 3:
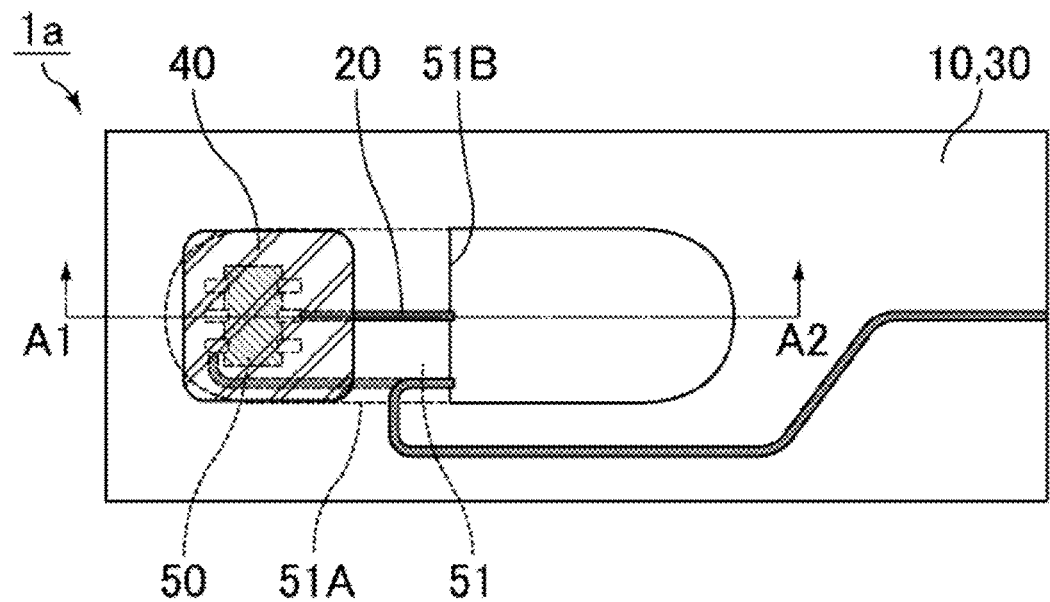
FIG. 3 is a schematic plan view illustrating a state after the mounting portion of the amplifier in FIG. 1 is folded back.
Figure 4:
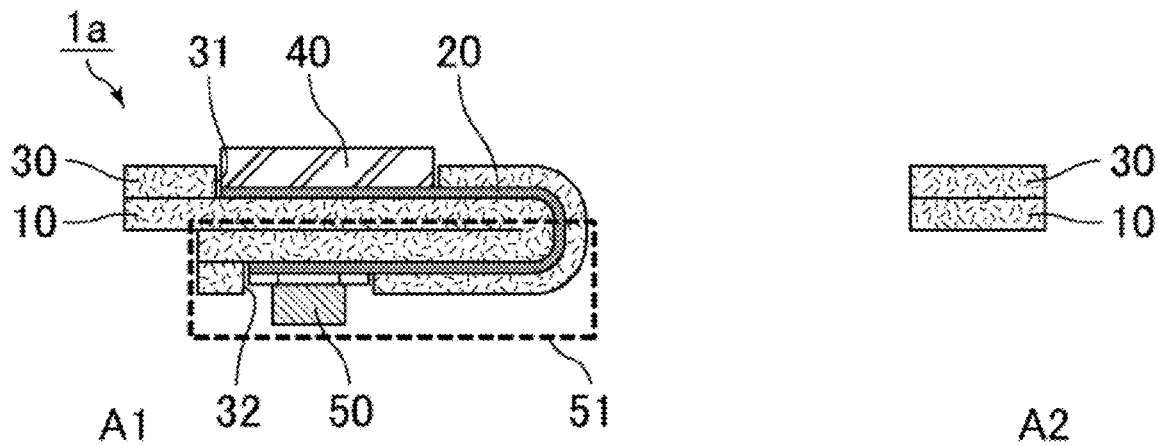
FIG. 4 is a schematic sectional view illustrating a portion corresponding to a line segment A1-A2 in FIG. 3.

When the mounting portion 51 of the amplifier is folded back from the second main surface side to the first main surface side of the elastic mounting board 1a, states illustrated in FIGS. 3 and 4 can be obtained. FIG. 3 is a schematic plan view illustrating a state after the mounting portion of the amplifier in FIG. 1 is folded back. FIG. 4 is a schematic sectional view illustrating a portion corresponding to a line segment A1-A2 in FIG. 3.

As illustrated in FIGS. 3 and 4, in the state after the mounting portion 51 of the amplifier is folded back, the electrode 40 faces the second main surface side of the elastic mounting board 1a, and the amplifier 50 faces the first main surface side of the elastic mounting board 1a. In the present specification, the "mounting portion of the amplifier" includes the elastic substrate and the elastic wiring arranged in the vicinity of the amplifier in addition to the amplifier.

As illustrated in FIGS. 1 and 3, in a state where the elastic mounting board 1a is viewed in the plan view, the mounting portion 51 of the amplifier is surrounded by a first contour line 51A and a second contour line 51B that connects both ends of the first contour line 51A. In the present embodiment, among four sides of the amplifier 50 having a rectangular planar shape, three sides face the first contour line 51A, and the remaining one side faces the second contour line 51B. The mounting portion 51 of the amplifier is separated from a peripheral portion along the first contour line 51A, and the mounting portion 51 is folded back along the second contour line 51B such that the amplifier 50 faces the first main surface side of the elastic mounting board 1a. Examples of the method of separating the mounting portion 51 of the amplifier from the peripheral portion along the first contour line 51A include laser machining, punching, and the like.

The elastic mounting board 1a can be used as a sensor by being attached to a living body with the electrode 40 interposed therebetween.

As constituent materials of the first elastic substrate 10 and the second elastic substrate 30, for example, a resin such as thermoplastic polyurethane is preferred. The constituent materials of the first elastic substrate 10 and the second elastic substrate 30 may be the same as each other or may be different from each other.

The first elastic substrate 10 and the second elastic substrate 30 may be bonded to each other in a region where the elastic wiring 20 is not arranged. In a case where the constituent materials of the first elastic substrate 10 and the second elastic substrate 30 are thermoplastic resins, the first elastic substrate 10 and the second elastic substrate 30 can be bonded by thermal bonding. The first elastic substrate 10 and the second elastic substrate 30 may be bonded to each other by an adhesive.

In a case where the elastic mounting board 1a is attached to a living body, from the viewpoint of not inhibiting the expansion and contraction of a living body surface, the thickness of each of the first elastic substrate 10 and the second elastic substrate 30 is preferably 0.1 μm to 100 μm, and more preferably 0.1 μm to 1 μm. The thicknesses of the first elastic substrate 10 and the second elastic substrate 30 may be the same as each other or may be different from each other.

As the constituent material of the elastic wiring 20, a mixture of a conductive particle and a resin is preferable. Examples of such a mixture include a mixture of a metal powder such as silver, copper and nickel as the conductive particle and an elastomer resin such as a silicone resin. The average particle size of the conductive particles is preferably 0.01 μm to 10 μm. The shape of the conductive particles is preferably spherical.

The thickness of the elastic wiring 20 is preferably 1 μm to 100 μm, more preferably 1 μm to 50 μm.

The electrode 40 plays a role of receiving a biological signal in a case where the elastic mounting board 1a is attached to a living body. The electrode 40 is preferably a gel electrode. By using the gel electrode, the elastic mounting board 1a can be easily attached to a living body. The gel electrode is composed of a conductive gel material containing, for example, water, alcohol, a moisturizer, an electrolyte, and the like. Examples of such gel materials include hydrogels and the like.

In a case where the electrode 40 is a gel electrode, it is preferable that the gel electrode protrudes from the second elastic substrate 30 and past the second main surface of the elastic mounting board 1a, as illustrated in FIGS. 2 and 4. In a case where the gel electrode protrudes from the second elastic substrate 30 and past the second main surface of the elastic mounting board 1a, the gel electrode easily follows the unevenness of a living body surface when the elastic mounting board 1a is attached to a living body with the gel electrode interposed therebetween. Therefore, the adhesion between the gel electrode and the living body surface is enhanced. Further, the interfacial resistance between the gel electrode and the living body surface is lowered.

In a case where the electrode 40 is a gel electrode, the thickness of a portion of the gel electrode, which protrudes from the second elastic substrate 30 and past the second main surface of the elastic mounting board 1a, is preferably 1 µm to 1 mm, and more preferably 100 µm to 1 mm.

The amplifier 50 is a kind of functional component, and has a function of amplifying a signal transmitted through the elastic wiring 20. Specifically, with the amplifier 50, the minute biological signals received by the electrode 40 are amplified, and transmitted to the subsequent circuit without being attenuated. Since noise easily enters the elastic wiring 20 when the elastic mounting board 1a expands and contracts, the amplifier 50 is also useful from the viewpoint of suppressing the influence of noise. Examples of the amplifier 50 include operational amplifiers, transistors, and the like.

As illustrated in FIGS. 3 and 4, in the elastic mounting board 1a, the mounting portion 51 of the amplifier is folded back such that the amplifier 50 faces the first main surface side of the elastic mounting board 1a and the electrode 40 faces the second main surface side of the elastic mounting board 1a. Since the mounting portion 51 of the amplifier is folded back, even if the elastic mounting board 1a expands and contracts when being attached to a living body, the mounting portion 51 of the amplifier is difficult to be affected, and as a result, it is difficult for the amplifier 50 to come off. Further, unlike the electrode sheet described in Patent Document 1, even if the elasticity of the mounting portion 51 of the amplifier is not made smaller than the elasticity of other portions, when the elastic mounting board 1a expands and contracts, changes in signal amplification characteristics (for example, gain for each frequency) of the amplifier 50 are suppressed, and damage to the amplifier 50 is also prevented.

From the viewpoint of amplifying the biological signal while suppressing the influence of noise entering the elastic wiring 20 when the elastic mounting board 1a expands and contracts, the shorter the elastic wiring 20 between the electrode 40 and the amplifier 50, the more preferable. However, in a case where the elastic wiring 20 between the electrode 40 and the amplifier 50 is too short, in a state (for example, state illustrated in FIGS. 1 and 2) where the mounting portion 51 of the amplifier is not folded back, when the elastic mounting board 1a is attached to a living body, the amplifier 50, which is thicker than the electrode 40, interferes with the living body, and the electrode 40 floats from the living body surface (the electrode 40 does not come into contact with the living body surface).

On the other hand, in the elastic mounting board 1a, since the mounting portion 51 of the amplifier is folded back, the amplifier 50 does not interfere with a living body when the elastic mounting board 1a is attached to the living body. Therefore, in the elastic mounting board 1a, the elastic wiring 20 between the electrode 40 and the amplifier 50 can be shortened as much as possible. As a result, when the amplifier 50 amplifies the biological signal, the influence of noise entering the elastic wiring 20 when the elastic mounting board 1a expands and contracts is suppressed as much as possible.

The mounting portion 51 of the amplifier may be folded back such that the electrode 40 and the amplifier 50 overlap in the plan view as illustrated in FIG. 3, but the mounting portion 51 of the amplifier may be folded back such that the electrode 40 and the amplifier 50 do not overlap in the plan view.

In a case where the mounting portion 51 of the amplifier is folded back such that the electrode 40 and the amplifier 50 do not overlap in the plan view, since the total thickness of the first elastic substrate 10 and the second elastic substrate 30 is larger in a portion in the elastic mounting board 1a where the mounting portion 51 of the amplifier is folded back than in the unfolded portion, the portion where the mounting portion 51 of the amplifier is folded back is difficult to expand and contract. Therefore, the mounting portion 51 of the amplifier is difficult to expand and contract when the elastic mounting board 1a expands and contracts.

On the other hand, in a case where the mounting portion 51 of the amplifier is folded back such that the electrode 40 and the amplifier 50 overlap in the plan view, in the portion in the elastic mounting board 1a where the mounting portion 51 of the amplifier is folded back, the electrode 40 is included in addition to the first elastic substrate 10, the second elastic substrate 30, and the amplifier 50. Therefore, the total thickness of the portion in the elastic mounting board 1a where the mounting portion 51 of the amplifier is folded back is larger in a case where the mounting portion 51 of the amplifier is folded back such that the electrode 40 and the amplifier 50 overlap in the plan view than in a case where the mounting portion 51 of the amplifier is folded back such that the electrode 40 and the amplifier 50 do not overlap in the plan view. Therefore, the mounting portion 51 of the amplifier is more difficult to expand and contract when the elastic mounting board 1a expands and contracts. Further, considering that a portion where the electrode 40 is arranged is difficult to expand and contract when the elastic mounting board 1a expands and contracts, in a case where the electrode 40 and the amplifier 50 overlap in the plan view in a state where the mounting portion 51 of the amplifier is folded back, the mounting portion 51 of the amplifier is difficult to expand and contract when the elastic mounting board 1a expands and contracts.

Second Embodiment

In the elastic mounting board of the present invention, in the first elastic substrate, a portion belonging to the mounting portion of the amplifier and a portion not belonging to the mounting portion of the amplifier may be bonded at a position where the portions and the amplifier do not overlap in the plan view. Such an example will be described as an elastic mounting board according to a second embodiment of the present invention. The elastic mounting board according to the second embodiment of the present invention is similar to the elastic mounting board according to the first embodiment of the present invention, except that the folded first elastic substrate is bonded in part.

Figure 5:
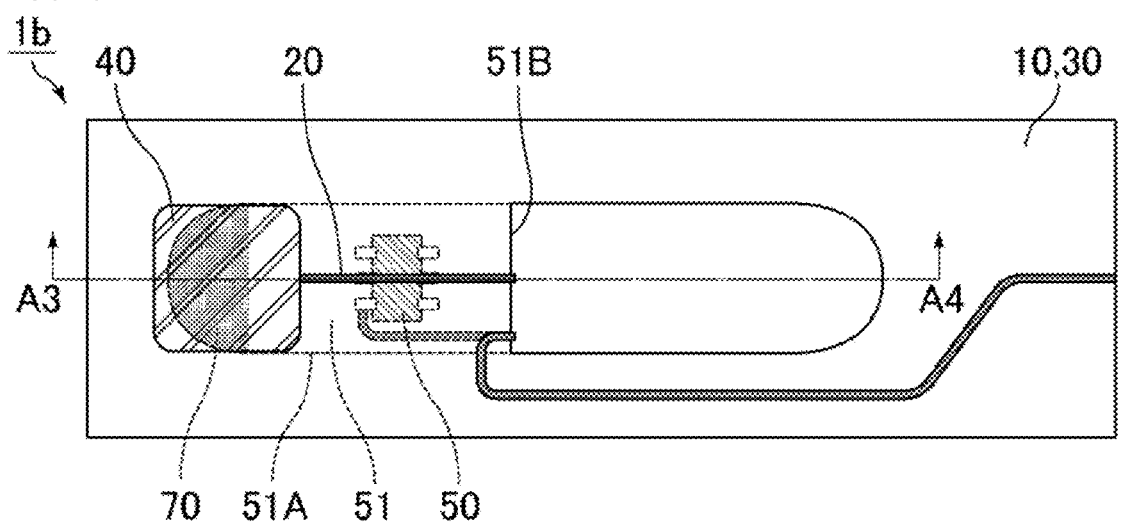
FIG. 5 is a schematic plan view illustrating an elastic mounting board according to a second embodiment of the present invention.
Figure 6:
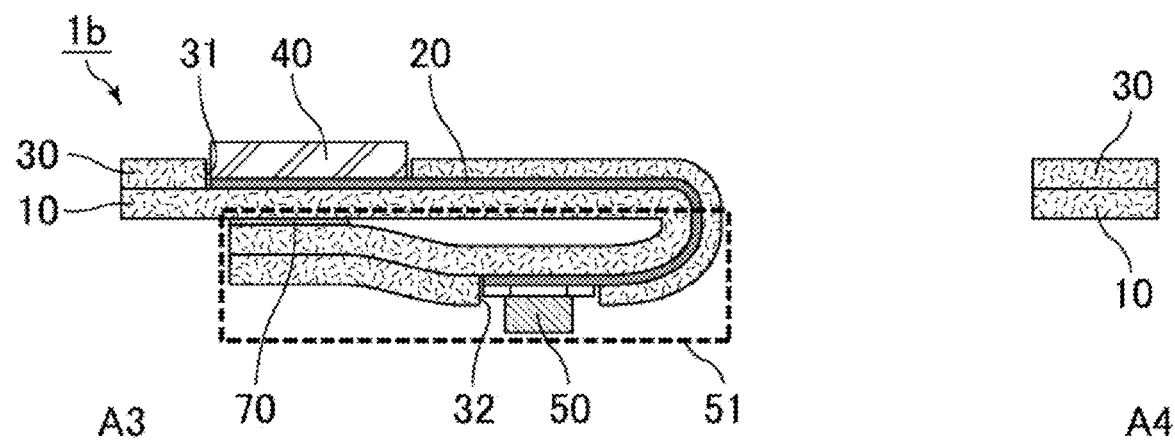
FIG. 6 is a schematic sectional view illustrating a portion corresponding to a line segment A3-A4 in FIG. 5.

FIG. 5 is a schematic plan view illustrating the elastic mounting board according to the second embodiment of the present invention. FIG. 6 is a schematic sectional view illustrating a portion corresponding to a line segment A3-A4 in FIG. 5.

As illustrated in FIGS. 5 and 6, in an elastic mounting board 1b, the mounting portion 51 of the amplifier is folded back such that the amplifier 50 faces the first main surface side of the elastic mounting board 1b and the electrode 40 faces the second main surface side of the elastic mounting board 1b. More specifically, the mounting portion 51 of the amplifier is separated from the peripheral portion along the first contour line 51A, and the mounting portion 51 is folded back along the second contour line 51B such that the amplifier 50 faces the first main surface side of the elastic mounting board 1b.

In the first elastic substrate 10, a portion belonging to the mounting portion 51 of the amplifier and a portion not belonging to the mounting portion 51 of the amplifier are bonded at a position where the portions and the amplifier 50 do not overlap in the plan view. In other words, the folded first elastic substrate 10 is bonded in part by an adhesive portion 70, and the adhesive portion 70 is provided at a position where the adhesive portion 70 and the amplifier 50 do not overlap in the plan view. By providing the adhesive portion 70 at a position where the adhesive portion 70 and the amplifier 50 do not overlap in the plan view, the folded portion (the mounting portion 51 of the amplifier) of the elastic mounting board 1b floats from the unfolded portion (the folded portion does not come into contact with the unfolded portion) at a position where the unfolded portion and the amplifier 50 overlap in the plan view. Therefore, in a state where the elastic mounting board 1b is attached to a living body, the influence of the expansion and contraction of the attachment surface of the elastic mounting board 1b is difficult to affect the amplifier 50, and as a result, it is difficult for the amplifier 50 to come off. Further, since the vibration of the attachment surface of the elastic mounting board 1b is difficult to be transmitted to the amplifier 50, noise due to the vibration is reduced.

Examples of the constituent material of the adhesive portion 70 include epoxy resins, urethane resins, acrylic resins, phenol resins, vinyl acetate resins, chloroprene rubber, styrene-butadiene rubber, isoprene rubber, natural rubber, and the like.

As the position where the adhesive portion 70 and the amplifier 50 do not overlap in the plan view, the adhesive portion 70 may be provided at a position where the adhesive portion 70 and the electrode 40 overlap in the plan view as illustrated in FIG. 5, but may be provided at a position where the adhesive portion 70 and the electrode 40 do not overlap in the plan view.

Third Embodiment

In the elastic mounting board of the present invention, the functional component may be a connector. Such an example will be described as an elastic mounting board according to a third embodiment of the present invention. The elastic mounting board according to the third embodiment of the present invention is similar to the elastic mounting board according to the first embodiment of the present invention, except that the connector is mounted instead of the amplifier.

Figure 7:
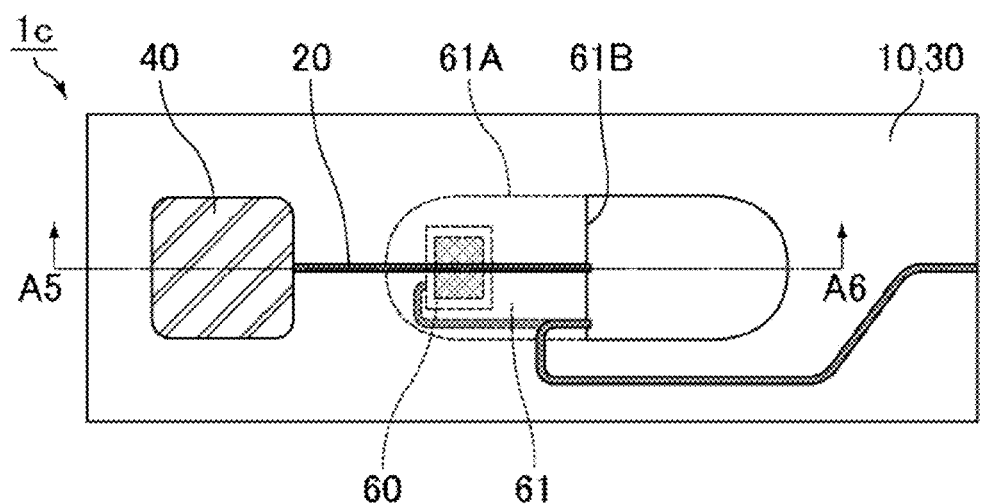
FIG. 7 is a schematic plan view illustrating an elastic mounting board according to a third embodiment of the present invention.
Figure 8:
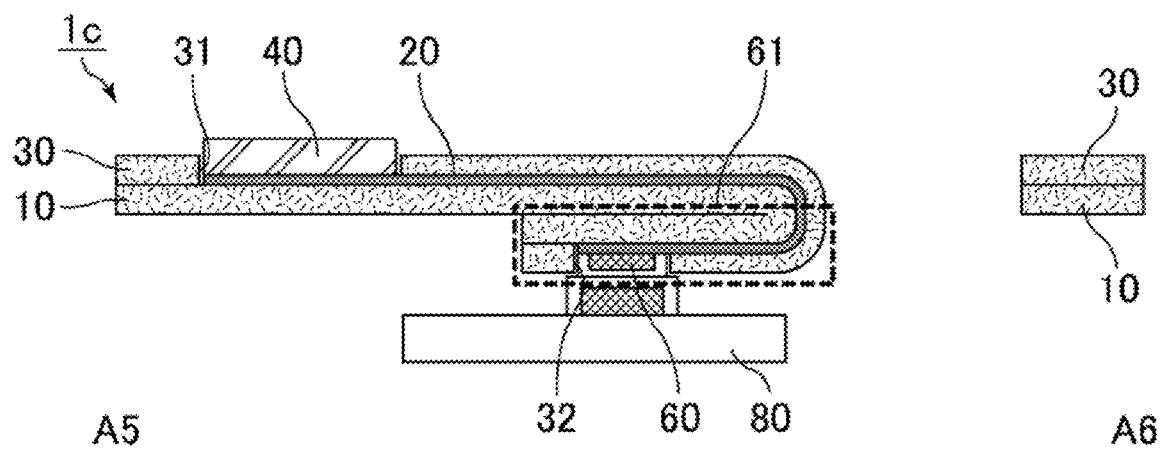
FIG. 8 is a schematic sectional view illustrating a portion corresponding to a line segment A5-A6 in FIG. 7.

FIG. 7 is a schematic plan view illustrating the elastic mounting board according to the third embodiment of the present invention. FIG. 8 is a schematic sectional view illustrating a portion corresponding to a line segment A5-A6 in FIG. 7. In FIG. 8, an external board which is not illustrated in FIG. 7 is also illustrated.

As illustrated in FIGS. 7 and 8, an elastic mounting board 1c includes the first elastic substrate 10, the elastic wiring 20, the second elastic substrate 30, the electrode 40, and a connector 60. The elastic mounting board 1c is connected to the external board 80 with the connector 60 interposed therebetween.

The connector 60 is mounted in the second opening 32 of the second elastic substrate 30 to be on one main surface of the elastic wiring 20 (on the surface on a side opposite to the first elastic substrate 10). That is, the connector 60 is electrically connected to the elastic wiring 20.

The connector 60 is a kind of functional components, and has a function of electrically connecting the elastic wiring 20 and the external board 80. A vertical connector can be used as the connector 60.

In the elastic mounting board 1c, a mounting portion 61 of the connector is folded back such that the connector 60 faces the first main surface side of the elastic mounting board 1c and the electrode 40 faces the second main surface side of the elastic mounting board 1c. More specifically, in a state where the elastic mounting board 1c is viewed in the plan view as illustrated in FIG. 7, the mounting portion 61 of the connector is surrounded by a first contour line 61A and a second contour line 61B that connects both ends of the first contour line 61A. The mounting portion 61 of the connector is separated from a peripheral portion along the first contour line 61A, and the mounting portion 61 is folded back along the second contour line 61B such that the connector 60 faces the first main surface side of the elastic mounting board 1c. Since the mounting portion 61 of the connector is folded back, even if the elastic mounting board 1c expands and contracts when being attached to a living body, the mounting portion 61 of the connector is difficult to be affected, and as a result, it is difficult for the connector 60 to come off. In the present specification, the "mounting portion of the connector" includes the elastic substrate and the elastic wiring arranged in the vicinity of the connector in addition to the connector.

In the elastic mounting board 1c, since the mounting portion 61 of the connector is folded back, the connector 60 does not interfere with a living body when the elastic mounting board 1c is attached to the living body. Therefore, in a state where the external board 80 is connected to the connector 60, since the vibration from the living body is difficult to be transmitted to the connection portion thereof, noise due to the vibration is reduced. Further, it is not necessary to fix the external board 80 for the purpose of preventing vibration.

In a state where the elastic mounting board 1c is attached to a living body, since the connector 60 faces a side opposite to the living body so as to be easily visible, the connection of the external board 80 to the connector 60 becomes easy. Further, if a vertical connector is used as the connector 60, the connection of the external board 80 to the connector 60 becomes easier.

In the elastic mounting board 1c, the connector 60 easily faces the first main surface side of the elastic mounting board 1c by simply folding back the mounting portion 61 of the connector. As the method of causing the connector 60 to face the first main surface side of the elastic mounting board 1c, a method is considered in which an opening is provided in the first elastic substrate 10 to lead out the elastic wiring 20 to the first main surface side of the elastic mounting board 1c, and the connector 60 is connected thereto, but it is difficult to perform the method with high accuracy. From the viewpoint, the configuration in which the mounting portion 61 of the connector is folded back as in the elastic mounting board 1c is extremely useful.

Fourth Embodiment

In the elastic mounting board of the present invention, in the first elastic substrate, a portion belonging to the mounting portion of the connector and a portion not belonging to the mounting portion of the connector may be bonded at a position where the portions and the connector do not overlap in the plan view. Such an example will be described as an elastic mounting board according to a fourth embodiment of the present invention. The elastic mounting board according to the fourth embodiment of the present invention is similar to the elastic mounting board according to the third embodiment of the present invention, except that the first elastic substrate is bonded in part in the folded state.

Figure 9:
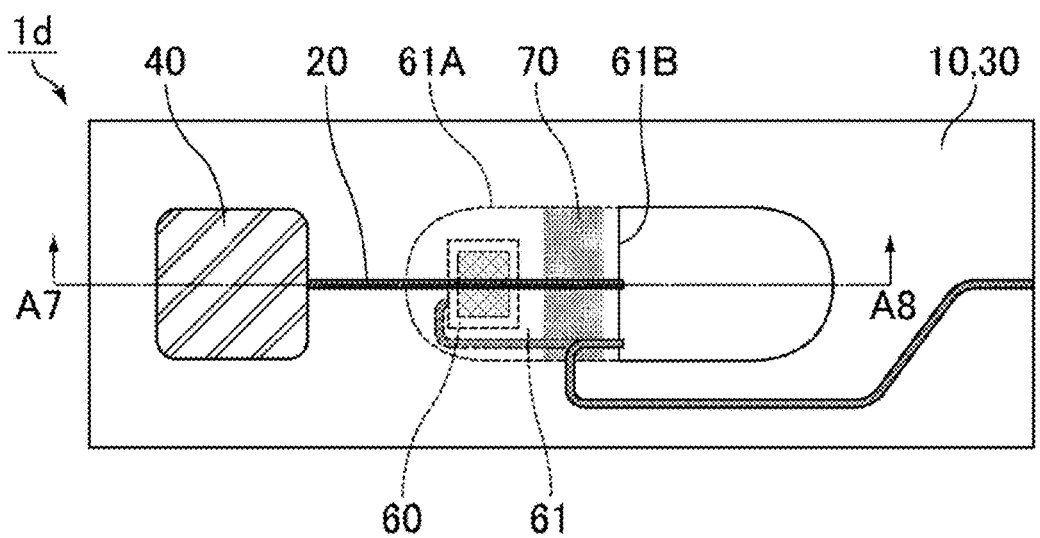
FIG. 9 is a schematic plan view illustrating an elastic mounting board according to a fourth embodiment of the present invention.
Figure 10:
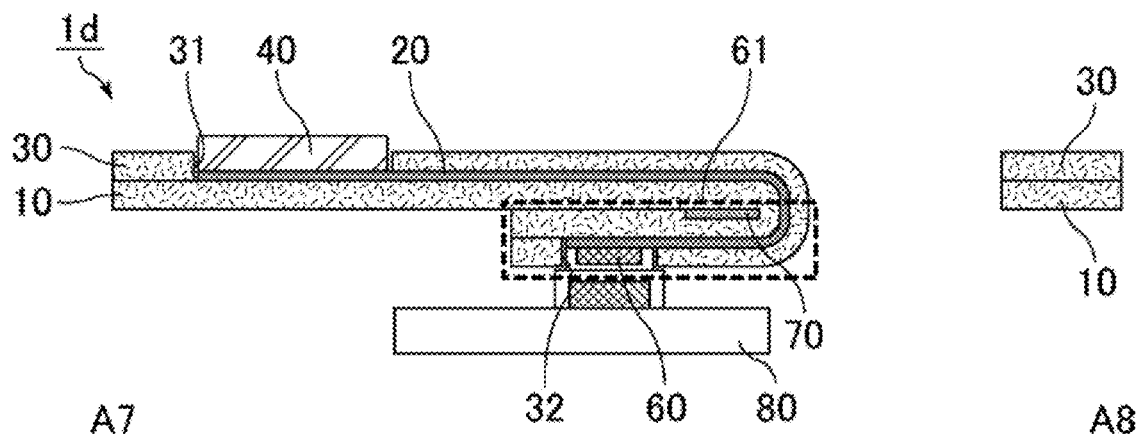
FIG. 10 is a schematic sectional view illustrating a portion corresponding to a line segment A7-A8 in FIG. 9.

FIG. 9 is a schematic plan view illustrating the elastic mounting board according to the fourth embodiment of the present invention. FIG. 10 is a schematic sectional view illustrating a portion corresponding to a line segment A7-A8 in FIG. 9. In FIG. 10, the external board which is not illustrated in FIG. 9 is also illustrated.

As illustrated in FIGS. 9 and 10, in an elastic mounting board 1d, the mounting portion 61 of the connector is folded back such that the connector 60 faces the first main surface side of the elastic mounting board 1d and the electrode 40 faces the second main surface side of the elastic mounting board 1d. More specifically, the mounting portion 61 of the connector is separated from the peripheral portion along the first contour line 61A, and the mounting portion 61 is folded back along the second contour line 61B such that the connector 60 faces the first main surface side of the elastic mounting board 1d.

In the first elastic substrate 10, a portion belonging to the mounting portion 61 of the connector and a portion not belonging to the mounting portion 61 of the connector are bonded at a position where the portions and the connector 60 do not overlap in the plan view.

In other words, the folded first elastic substrate 10 is bonded in part by the adhesive portion 70, and the adhesive portion 70 is provided at a position where the adhesive portion 70 and the connector 60 do not overlap in the plan view. By providing the adhesive portion 70 at a position where the adhesive portion 70 and the connector 60 do not overlap in the plan view, in a state where the elastic mounting board 1d is attached to a living body, the influence of the expansion and contraction of the attachment surface of the elastic mounting board 1d is difficult to affect the connector 60, and as a result, it is difficult for the connector 60 to come off. Further, since the vibration of the attachment surface of the elastic mounting board 1d is difficult to be transmitted to the connector 60, noise due to the vibration is reduced.

In the elastic mounting board according to each embodiment of the present invention described above, the amplifier 50 and the connector 60 as functional components may be covered with a resin material and fixed to the elastic wiring 20.

In the elastic mounting board according to each embodiment of the present invention described above, the amplifier 50 and the connector 60 are exemplified as the functional components, but other examples of the functional components include switches, sensors, and the like.

In the elastic mounting board according to each embodiment of the present invention described above, the configuration having the first elastic substrate 10 and the second elastic substrate 30 as the elastic substrate is exemplified, but a configuration having only the first elastic substrate 10 as the elastic substrate may be adopted.

DESCRIPTION OF REFERENCE SYMBOLS 1a, 1b, 1c, 1d: Elastic mounting board
10: First elastic substrate
20: Elastic wiring
30: Second elastic substrate
31: First opening
32: Second opening
40: Electrode
50: Amplifier
51: Mounting portion of amplifier
51A: First contour line of mounting portion of amplifier
51B: Second contour line of mounting portion of amplifier
60: Connector
61: Mounting portion of connector
61A: First contour line of mounting portion of connector
61B: Second contour line of mounting portion of connector
70: Adhesive portion
80: External board

The invention claimed is:

1. An elastic mounting board comprising:
a first elastic substrate;
an elastic wiring on a first main surface of the first elastic substrate;
a second elastic substrate arranged such that the elastic wiring is interposed between the second elastic substrate and the first elastic substrate, the second elastic substrate defining a first opening and a second opening;
an electrode electrically connected to the elastic wiring, wherein the electrode is arranged in and exposed from the first opening; and
a functional component mounted in a mounting portion of the first elastic substrate and electrically connected to the elastic wiring, wherein the functional component is arranged in and exposed from the second opening,
wherein the mounting portion having the functional component is constructed to be folded back such that the functional component will face a first main surface side of the elastic mounting board and the electrode will face a second main surface side of the elastic mounting board.

2. The elastic mounting board according to claim 1, wherein
in a plan view of the elastic mounting board, the mounting portion is defined by a first contour line and a second contour line that connects opposed ends of the first contour line, and
the mounting portion is separated from a peripheral portion of the first elastic substrate along the first contour line, and is constructed to be folded back along the second contour line such that the functional component will face the first main surface side of the elastic mounting board.

3. The elastic mounting board according to claim 2, wherein, when the mounting portion having the functional component is folded back such that the functional component faces the first main surface side of the elastic mounting board and the electrode faces the second main surface side of the elastic mounting board, the functional component and the electrode overlap each other in the plan view of the elastic mounting board.

4. The elastic mounting board according to claim 3, wherein a portion of the mounting portion that is folded back is bonded to the first elastic substrate at a bonding position where the functional component and the bonding position do not overlap each other in the plan view of the elastic mounting board.

5. The elastic mounting board according to claim 2, wherein, when the mounting portion having the functional component is folded back such that the functional component faces the first main surface side of the elastic mounting board and the electrode faces the second main surface side of the elastic mounting board, the functional component and the electrode do not overlap each other in the plan view of the elastic mounting board.

6. The elastic mounting board according to claim 5, wherein a portion of the mounting portion that is folded back is bonded to the first elastic substrate at a bonding position where the functional component and the bonding position do not overlap each other in the plan view of the elastic mounting board.

7. The elastic mounting board according to claim 1, wherein
in a plan view of the elastic mounting board, the mounting portion is defined by a first contour line and a second contour line that connects opposed ends of the first contour line, and
the mounting portion is separated from a peripheral portion of the first elastic substrate along the first contour line, and is constructed to be folded back along the second contour line such that the functional component will face the first main surface side of the elastic mounting board.

8. The elastic mounting board according to claim 7, wherein, when the mounting portion having the functional component is folded back such that the functional component faces the first main surface side of the elastic mounting board and the electrode faces the second main surface side of the elastic mounting board, the functional component and the electrode overlap each other in the plan view of the elastic mounting board.

9. The elastic mounting board according to claim 8, wherein a portion of the mounting portion that is folded back is bonded to the first elastic substrate at a bonding position where the functional component and the bonding position do not overlap each other in the plan view of the elastic mounting board.

10. The elastic mounting board according to claim 7, wherein, when the mounting portion having the functional component is folded back such that the functional component faces the first main surface side of the elastic mounting board and the electrode faces the second main surface side of the elastic mounting board, the functional component and the electrode do not overlap each other in the plan view of the elastic mounting board.

11. The elastic mounting board according to claim 10, wherein a portion of the mounting portion that is folded back is bonded to the first elastic substrate at a bonding position where the functional component and the bonding position do not overlap each other in the plan view of the elastic mounting board.

12. The elastic mounting board according to claim 1, wherein the functional component is an amplifier.

13. The elastic mounting board according to claim 1, wherein the functional component is a connector.

14. The elastic mounting board according to claim 1, wherein, when the mounting portion having the functional component is folded back such that the functional component faces the first main surface side of the elastic mounting board and the electrode faces the second main surface side of the elastic mounting board, the functional component and the electrode overlap each other in a plan view of the elastic mounting board.

15. The elastic mounting board according to claim 14, wherein a portion of the mounting portion that is folded back is bonded to the first elastic substrate at a bonding position where the functional component and the bonding position do not overlap each other in the plan view of the elastic mounting board.

16. The elastic mounting board according to claim 1, wherein, when the mounting portion having the functional component is folded back such that the functional component faces the first main surface side of the elastic mounting board and the electrode faces the second main surface side of the elastic mounting board, the functional component and the electrode do not overlap each other in a plan view of the elastic mounting board.

17. The elastic mounting board according to claim 16, wherein a portion of the mounting portion that is folded back is bonded to the first elastic substrate at a bonding position where the functional component and the bonding position do not overlap each other in the plan view of the elastic mounting board.

18. The elastic mounting board according to claim 1, wherein the electrode is a gel electrode.

19. The elastic mounting board according to claim 1, further comprising a resin material covering the functional component.

* * * * *